United States Patent
Tseng et al.

(10) Patent No.: US 7,129,025 B2
(45) Date of Patent: Oct. 31, 2006

(54) FABRICATION METHOD OF A THREE-DIMENSIONAL MICROSTRUCTURE

(75) Inventors: Fan-Gang Tseng, Hsinchu (TW); Yun-Ju Chuang, Taoyuan (TW)

(73) Assignee: National Tsing Hua University, Hsinchu (TW)

( * ) Notice: Subject to any disclaimer, the term of this patent is extended or adjusted under 35 U.S.C. 154(b) by 57 days.

(21) Appl. No.: 10/438,527

(22) Filed: May 14, 2003

(65) Prior Publication Data

US 2003/0215753 A1    Nov. 20, 2003

(30) Foreign Application Priority Data

May 17, 2002    (TW) .................................. 91110538

(51) Int. Cl.
*G03C 5/00*    (2006.01)
(52) U.S. Cl. ........................ 430/312; 430/394; 430/950
(58) Field of Classification Search ................ 430/394, 430/312, 315, 950
See application file for complete search history.

(56) References Cited

U.S. PATENT DOCUMENTS

| | | | |
|---|---|---|---|
| 6,245,492 B1 * | 6/2001 | Huang et al. | ................ 430/326 |
| 6,569,575 B1 * | 5/2003 | Biebuyck et al. | .............. 430/5 |
| 6,762,012 B1 * | 7/2004 | Kim et al. | ................... 430/320 |
| 2003/0091936 A1 * | 5/2003 | Rottstegge et al. | ......... 430/312 |
| 2004/0259042 A1 * | 12/2004 | Fritze et al. | ................ 430/394 |

* cited by examiner

*Primary Examiner*—John A. McPherson
*Assistant Examiner*—Daborah Chacko-Davis
(74) *Attorney, Agent, or Firm*—Egbert Law Offices

(57) ABSTRACT

A fabrication method of three-dimensional microstructures is to fabricate a real 3D microstructure. First, a substrate is coated with an anti-reflection layer to absorb reflected exposure light, and then the anti-reflection layer is overlaid with a first thick photoresist. After having been fully exposed by a first photo mask, a predetermined exposure depth of the first thick photoresist is achieved by a second photo mask and dosage-controlled UV exposure. If the unexposed areas of the first thick photoresist are released during a development step, a single-layer microstructure is created. Inversely, a multi-layered microstructure can be obtained simply by repeating the process described above. After all layers are laminated on the substrate, all unexposed areas of the all thick photoresist layers are released and connected to each other during a development step.

14 Claims, 7 Drawing Sheets

FABRICATION METHOD OF A THREE-DIMENSIONAL MICROSTRUCTURE

BACKGROUND OF THE INVENTION

1. Field of the Invention

The present invention relates to a fabrication method of three-dimensional (3D) microstructure, and more particularly, to a semiconductor process employing a thick photoresist by controlling exposure dosage to form a microstructure on a substrate.

2. Description of the Related Art

In recent years, microstructure devices have been developed for biochemistry, sensor science and pharmaceutics, and also have given rise to the advent of various fabrication techniques to fabricate microstructures made from various materials.

Embedded micro channels are generally used for microstructure devices to distribute and store micro fluid, and find applications in areas such as reagents, pharmaceuticals or inkjet printheads. There are at least four major methods that have been reported that use thick photoresist, such as SU-8 resist, to fabricate embedded micro channel structures. All the methods are superior to other non-mentioned micromachining techniques, such as excimer laser micromachining, especially in respect to costs and applicability.

As shown in FIGS. 1(a)–1(c), the first method discloses that a substrate 11 is overlaid with a filling material 13 and SU-8 layers 12 and 14 to define embedded micro channels. And then the filling material 13 is released from therein to obtain micro channels embedded in the substrate 11. UV light 15 is employed as an exposure source on SU-8 layers 12 and 14. However, this method must apply many different materials to finish one layer of embedded channel. In particular, the filling material 13 is different from the SU-8 layers 12, and negative effects in succeeding steps arise from their mismatching characteristics.

FIGS. 2(a)–2(c) illustrate the fabrication process of the second method. A whole SU-8 layer coated on the substrate 21 is directly overlaid with a metal mask 24 after exposed areas 22 and unexposed areas 23 arise from UV exposure. In the succeeding step, the metal mask 24 is coated with another SU-8 layer 25, and the SU-8 layer 25 is exposed to UV light 26. Therefore, the unexposed areas 23 of the lower SU-8 layer are not exposed to UV light 26 yet due to the metal mask 24. The micro channel can be released after the unexposed areas 23 are developed. Unfortunately, the metal mask 24 is a thin film liable to have cracks thereon. The cracks will cause a next stacked layer, such as SU-8 layer 25, failures. The root cause of the cracks is from the elevated temperature during an evaporation step or a succeeding baking step. Furthermore, the microstructure is also caused damage by the removal of the metal mask 24 thereafter.

The third method laminates a Riston film (dry film) 33 by a roller 34 on a SU-8 layer 32 formed on a substrate 31 to obtain micro channels, as show in FIGS. 3(a)–3(b). The adhesion uniformity problem between them is a serious concern during the laminating step. As shown in FIGS. 4(a)–4(c), a microstructure is formed on a substrate 41 by utilizing proton beam 44 to partially expose a SU-8 layer. The entire depth of SU-8 a layer can be fully exposed by a proton beam 44 with higher intensity. Therefore, the areas covered with a photo mask 46 are unexposed areas 43, the other areas are fully exposed areas 42. Under partial exposure of a proton beam 45 with lower intensity, the upper portions of the unexposed areas 43 become new exposed areas 42, and the lower portions of the unexposed areas 43 remain unexposed. In the fourth method, the proton beam 45 may be an elegant approach for dosage control on exposure, but not a popular source for common use.

In summary, the traditional methods for a microstructure either use more than two materials and a tedious process, or costly facilities like the proton beam, and are not simple enough for the fabrication of stacked channels.

SUMMARY OF THE INVENTION

The first objective of the present invention is to provide a fabrication method for three-dimensional microstructures. By employing a thick photoresist during a semiconductor process, a real 3D microstructure is formed on a substrate stacked with multi-layers.

The second objective of the present invention is to provide a method for controlling the exposure depth of a thick photoresist (or thickness). By simply employing dosage-controlled UV exposure, a predetermined exposure depth can be obtained in a thick photoresist. In additional, an anti-reflection layer on the photoresist-substrate interface can absorb reflected UV light to eliminate an undesired effect on dosage control.

The third objective of the present invention is to have a simpler process to fabricate a 3D microstructure, with fewer steps than in a lithography process and common equipment to achieve this fabrication.

In order to achieve these objectives, the present invention discloses a fabrication method of three-dimensional microstructures. First, a substrate is coated with an anti-reflection layer to absorb the reflected exposure light, and then the anti-reflection layer is overlaid with a first thick photoresist. After having been full exposed by a first photo mask, a predetermined exposure depth of the first thick photoresist is achieved by a second photo mask and dosage-controlled UV exposure. If the unexposed areas of the first thick photoresist are released during a development step, a single-layer microstructure is ready. Inversely, a multi-layered microstructure can be obtained simply by repeating the process described above. After all layers are laminated on the substrate, all unexposed areas of all of the thick photoresist layers are released and connected to each other during a development step.

BRIEF DESCRIPTION OF THE DRAWINGS

The invention will be described referring to the appended drawings in which.

PREFERRED EMBODIMENT OF THE PRESENT INVENTION

Figure 1A:
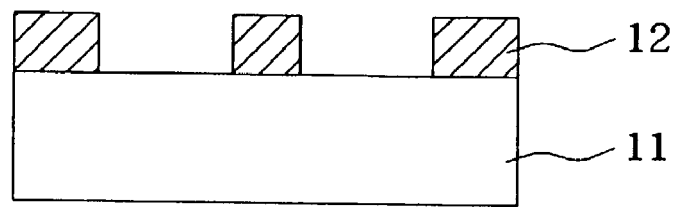
FIGS. 1(a)–1(c) show diagrams of the fabrication process of a microstructure in accordance with the first prior art.
Figure 1B:
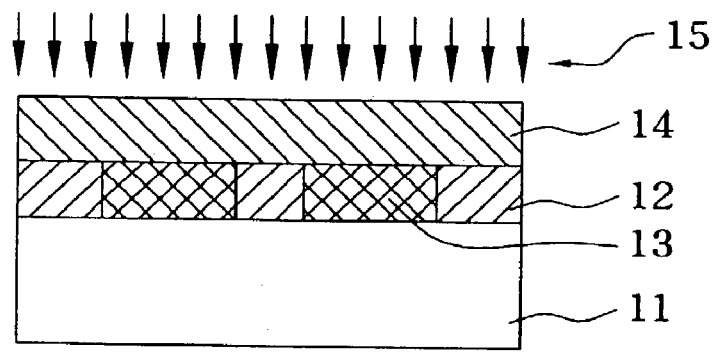
Figure 1C:
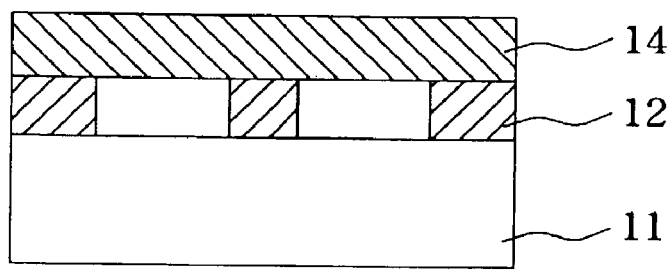
Figure 2A:
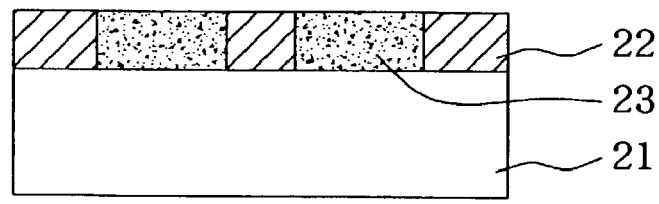
FIGS. 2(a)–2(c) show diagrams of the fabrication process of a microstructure in accordance with the second prior art.
Figure 2B:
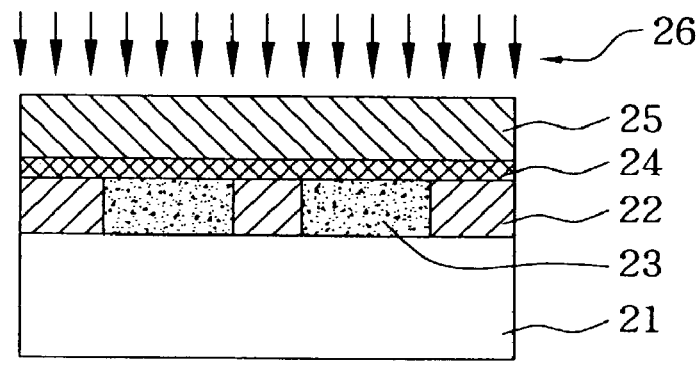
Figure 2C:
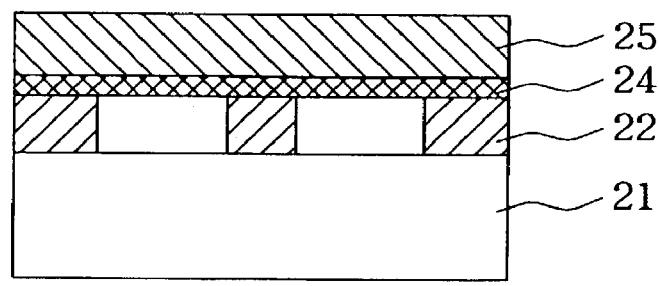
Figure 3A:
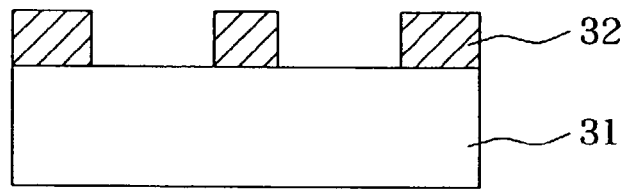
FIGS. 3(a)–3(b) show diagrams of the fabrication process of a microstructure in accordance with the third prior art.
Figure 3B:
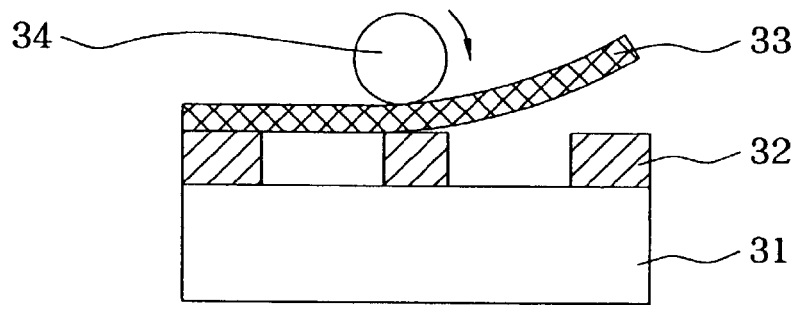
Figure 4A:
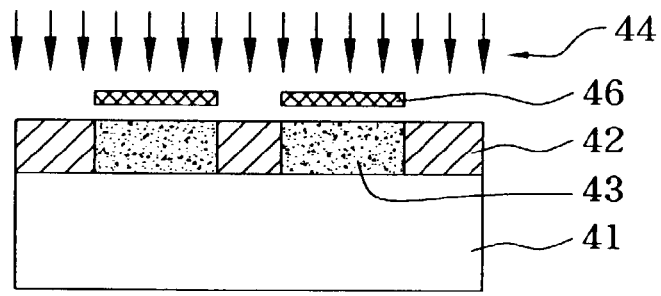
FIGS. 4(a)–4(b) show diagrams of the fabrication process of a microstructure in accordance with the fourth prior art.
Figure 4B:
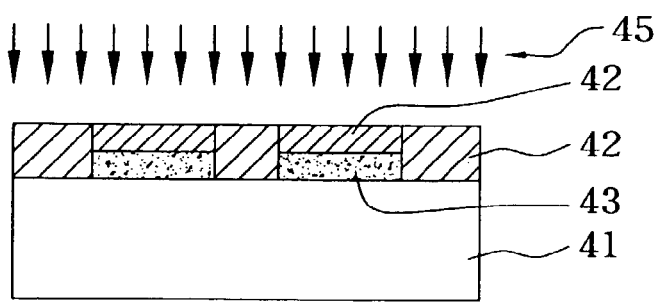
Figure 5A:
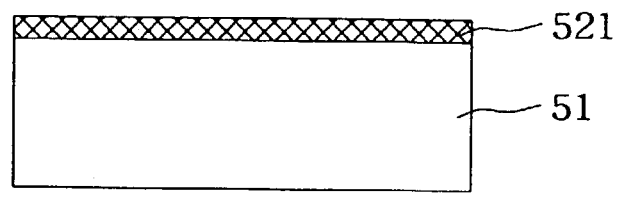
FIGS. 5(a)–5(f) show diagrams of the fabrication process of a 3D microstructure in accordance with the present invention.

FIGS. 5(a)–5(f) show diagrams of the fabrication process of a 3D microstructure in accordance with the present invention. A substrate 51 is uniformly coated with a first anti-reflection layer 521, as shown in FIG. 5(a). We can use a semiconductor wafer as the substrate 51. The first anti-reflection layer 521 is a photoresist capable of absorbing reflected light on the resist-substrate interface. The CK-6020L resist made by Fujifilm Co. is suitable to be used as a material for the anti-reflection layer due to its properties. In particular, UV light is completely absorbed by the CK-6020L resist.

Figure 5B:
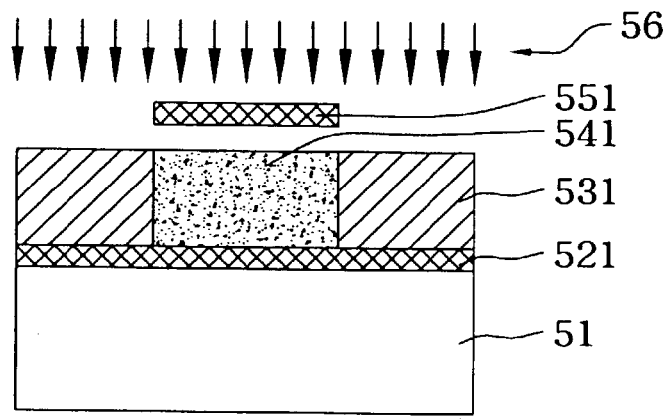
Figure 5C:
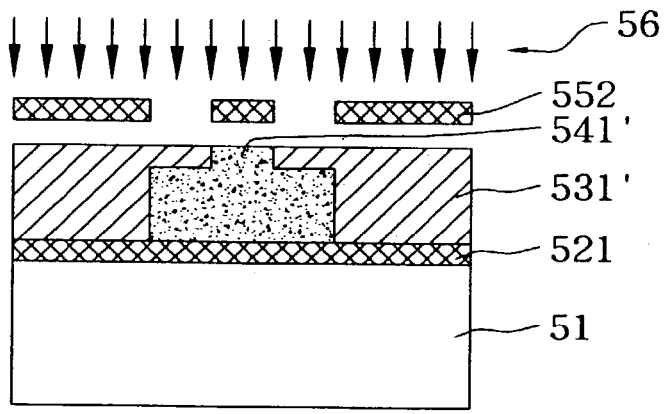

The first anti-reflection layer 521 is overlaid with a first SU-8 layer by a spin-on method. After the first exposure step by a first photo mask 551, the SU-8 layer is defined as exposed areas 531 and unexposed areas 541, as shown in FIG. 5(b). SU-8, a thick negative photoresist, has been used in the fabrication of microstructures for several years, because it has a high aspect ratio, good resolution, adequate mechanical properties and more suitable chemical properties than other thick photoresists. When the first SU-8 layer is exposed to UV light 56, molecules of the exposed areas 531 have a cross-link reaction between each other, thus the exposed areas 531 cannot be stripped during a development step.

A second photo mask 552 is employed during a second exposure step. Therefore, the top walls and sidewalls of microchannels are defined. In other words, adjusting exposure dosage and utilizing an anti-reflection layer can accurately control exposure depths from the upper surface of the unexposed areas 541. Upper portions of the original unexposed areas 541 become exposed areas 531' except the upper portions covered with the second photo mask 552, and lower portions of the original unexposed areas 541 remain unexposed areas 541'. Accordingly, microchannels embedded in a layer are well defined by unexposed areas 541'. If the unexposed areas 541' of the SU-8 layer are released during a development step, a single-layer microstructure is ready. Inversely, a multi-layered microstructure can be obtained simply by repeating the process described above. After all layers are laminated on the substrate 51, all unexposed areas of the all SU-8 layers are released and connected to each other during a development step.

Figure 5D:
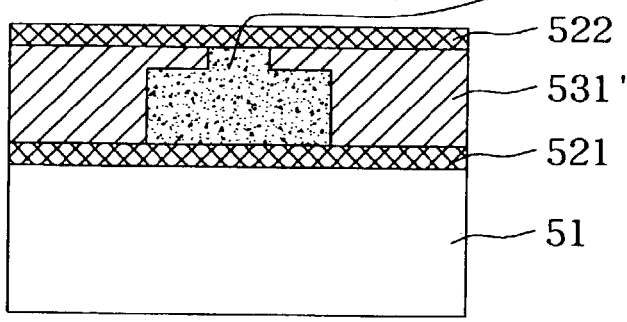
Figure 5E:
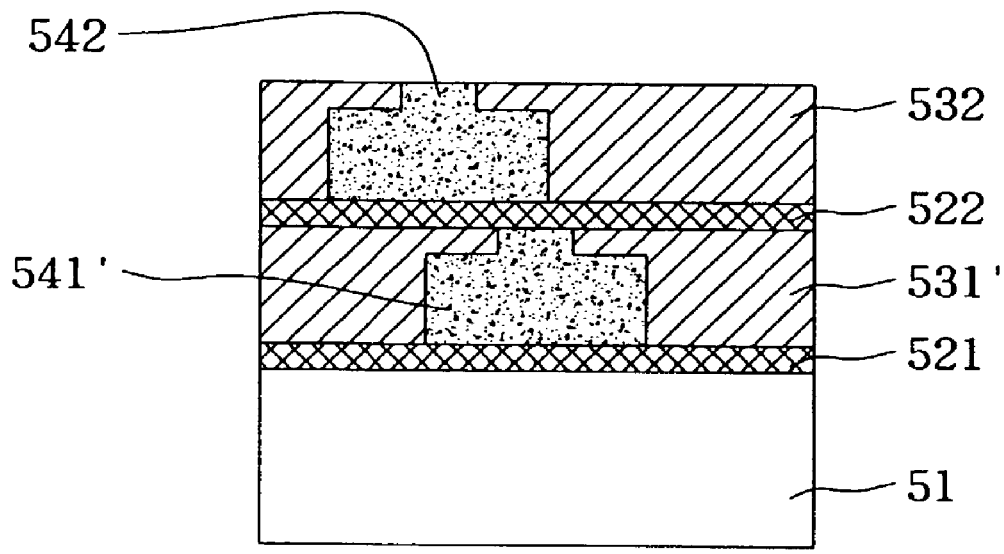
Figure 5F:
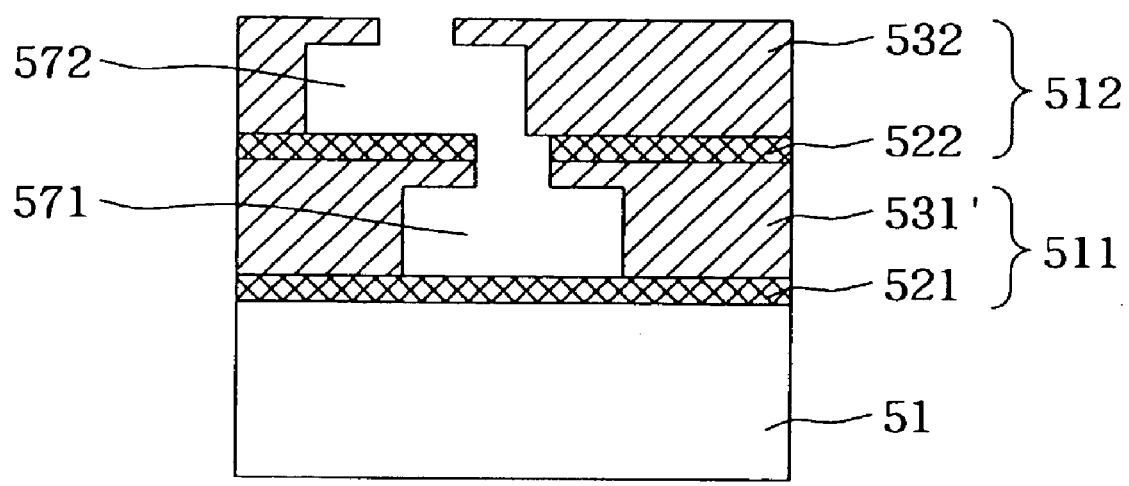

Before a second SU-8 layer is stacked on the first SU-8 layer, a second anti-reflection layer 522 is interposed therebetween, as shown in FIG. 5(d). By repeating the process described above, another microstructure layer including exposed areas 532 and unexposed areas 542 are obtained. Finally, all the unexposed areas 541' and unexposed areas 542 are released during a development step, and the partial first anti-reflection layer 521 located in microchannels is removed by an adequate solvent. Consequently, first microchannels 571 and second micro channels 572 are developed through paths and connected to each other, as shown in FIG. 5(f). A real 3D microstructure including a first microchannel layer 511 and a second micro-channel layer 512 is obtained.

Figure 6A:
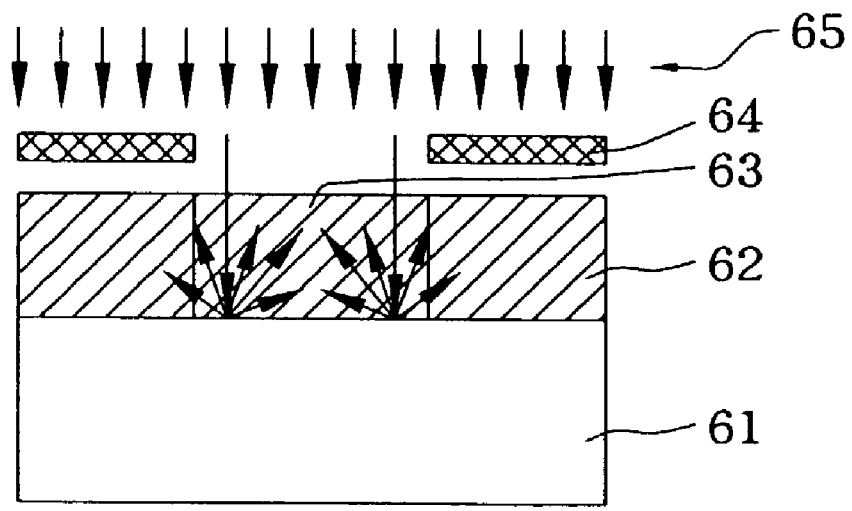
FIGS. 6(a)–6(b) show diagrams for explaining the formation theorems of a 3D microstructure in accordance with the present invention.
Figure 6B:
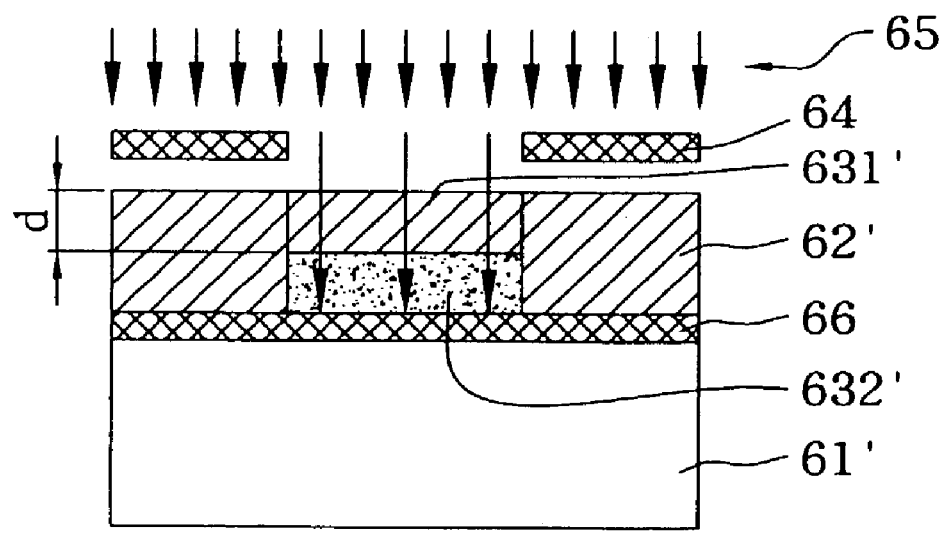

FIGS. 6(a)–6(b) shows diagrams for explaining the formation theorems of a 3D microstructure in accordance with the present invention. FIG. 6(a) shows an example of a microstructure without an anti-reflection layer contrary to FIG. 6(b). When UV light 65 passes through unexposed areas and gets to the interface between a SU-8 layer and a substrate 61, the UV light 65 is randomly reflected from the interface. Therefore, the lower portions of the unexposed areas are fully exposed to the reflected UV light 65. And unexposed areas become new exposed areas 63 with full exposure depth except for the original exposed areas 62 that are covered with a photo mask 64. It is difficult to control the exposure dosage to obtain a microstructure except for changing the exposure light.

Figure 7:
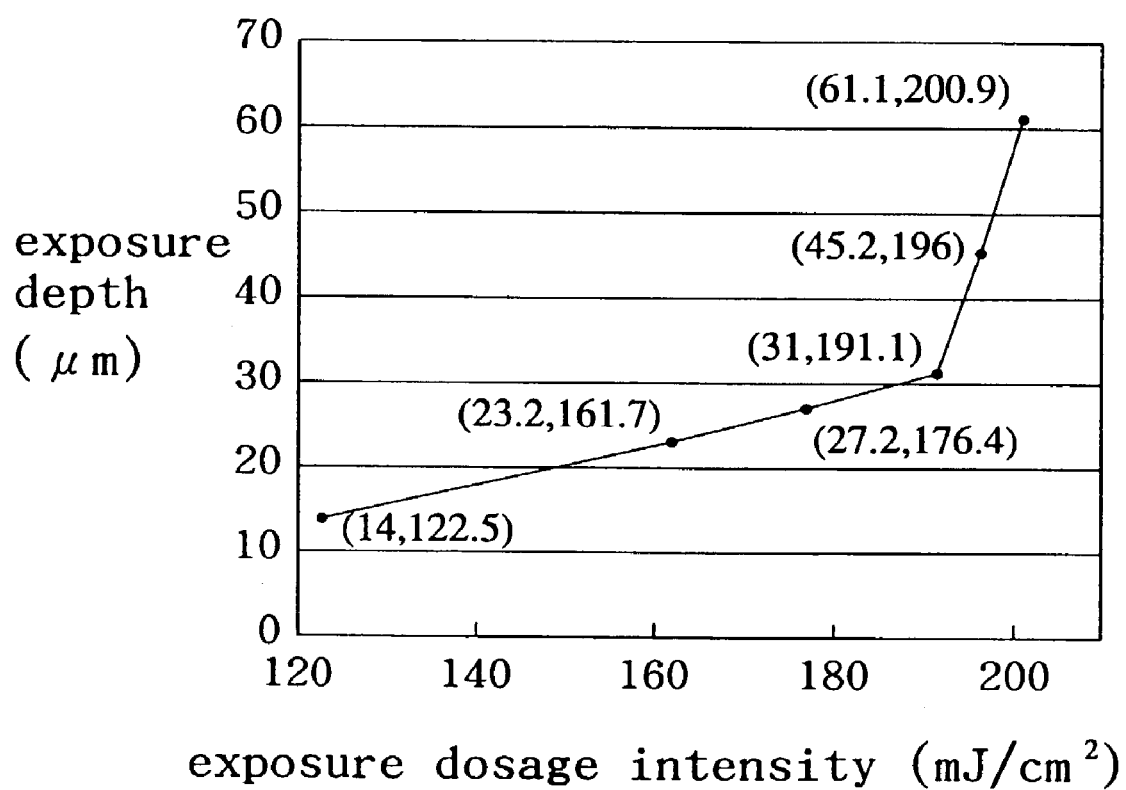
FIG. 7 shows a diagram of the relationship between exposure depth and exposure dosage intensity in accordance with the present invention.

In comparison with FIG. 6(b), an anti-reflection layer 66 is interposed between a SU-8 layer and a substrate 61'. The exposure depth d is controllable by adjusting the exposure dosage intensity. The exposure depth d is the thickness of the top wall in a predetermined microchannel, as shown in FIG. 6(d). That is, the anti-reflection layer 66 completely absorbs the reflected UV light, and the sufficient exposure energy of UV light cannot accumulate at the lower portions of SU-8 layer. After a second exposure step, there remain unexposed areas 632' and new exposed are as 631' except for the original exposed areas 62'. During a development step, the unexposed areas 632' is released to become microchannels. As shown in the following Table 1 and FIG. 7, the relationship between exposure depth and exposure dosage intensity is bi-linearly related for 120–200 mJ/cm². The datum 4 is the turning point of the slopes.

TABLE 1

| | The Relationship between Exposure Depth and Exposure Dosage Intensity | | | | | |
|---|---|---|---|---|---|---|
| Item | 1 | 2 | 3 | 4 | 5 | 6 |
| D (μm) | 14 | 23.2 | 27.2 | 31 | 45.2 | 61.1 |
| Intensity (mJ/cm2) | 22.5 | 161.7 | 176.4 | 191.1 | 196 | 200.9 |

The above-described embodiments of the present invention are intended to be illustrative only. Numerous alternative embodiments may be devised by persons skilled in the art without departing from the scope of the following claims.

What is claimed is:

1. A method of fabricating a three-dimensional microstructure, comprising:
    forming a first thick photoresist layer on a substrate;
    applying a first exposure by a first mask to said first thick photoresist layer so that exposed areas and unexposed areas are formed;
    applying a second exposure by a second mask to said unexposed areas of said first thick photoresist layer and adjusting an exposure dosage so that an exposure depth on said unexposed areas is formed, said exposure depth representing a thickness of a top wall of the microstructure, said exposure depth being less than a thickness of said first thick photoresist layer; and
    releasing said unexposed areas to form at least a microchannel between said top wall and said substrate in said first thick photoresist layer.

2. The method of claim 1, further comprising:
    disposing an anti-reflection layer between said first thick photoresist layer and said substrate for absorbing reflected exposure lights.

3. The method of claim 2, wherein the anti-reflection layer is formed by a material capable of absorbing ultraviolet light.

4. The method of claim 1, further comprising:
    stacking a second thick photoresist layer on said first thick photoresist layer.

5. The method of claim 4, further comprising:
    applying a first exposure to said second thick photoresist layer so that exposed areas and unexposed areas are formed; and
    applying a second exposure to said second thick photoresist layer and adjusting an exposure dosage so that an exposure depth on said unexposed areas of said second thick photoresist layer is formed.

6. The method of claim 5, further comprising:
disposing an anti-reflection layer between said first thick photoresist layer and said second thick photoresist layer for absorbing reflected exposure light and preventing said first thick photoresist layer from receiving exposure.

7. The method of claim 6, wherein said anti-reflection layer is formed by a material capable of absorbing ultraviolet light.

8. The method of claim 5, further comprising:
releasing unexposed areas of said first and second thick photoresist layers; and
releasing a portion of said anti-reflection layer in microchannels.

9. The method of claim 4, wherein said second thick photoresist layer is a negative photoresist.

10. The method of claim 9, wherein said negative photoresist is a SU-8 photoresist.

11. The method of claim 1, wherein said first thick photoresist layer is a negative photoresist.

12. The method of claim 11, wherein said negative photoresist is a SU-8 photoresist.

13. The method of claim 1, wherein said first and second exposures use ultraviolet light as a light source.

14. The method of claim 1, wherein said substrate is a wafer.

* * * * *